United States Patent
Sakai et al.

(10) Patent No.: US 10,493,567 B2
(45) Date of Patent: Dec. 3, 2019

(54) SOLDER ALLOY AND BONDED STRUCTURE USING THE SAME

(71) Applicant: Panasonic Intellectual Property Management Co., Ltd., Osaka (JP)

(72) Inventors: Kazuki Sakai, Osaka (JP); Akio Furusawa, Osaka (JP); Hidetoshi Kitaura, Osaka (JP); Kiyohiro Hine, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/949,360

(22) Filed: Apr. 10, 2018

(65) Prior Publication Data
US 2018/0326542 A1 Nov. 15, 2018

(30) Foreign Application Priority Data
May 11, 2017 (JP) .................. 2017-094971

(51) Int. Cl.
*B23K 35/26* (2006.01)
*C22C 13/02* (2006.01)
*H01L 23/00* (2006.01)

(52) U.S. Cl.
CPC ............ *B23K 35/262* (2013.01); *C22C 13/02* (2013.01); *H01L 24/29* (2013.01); *H01L 24/32* (2013.01); *H01L 2224/2912* (2013.01); *H01L 2224/29083* (2013.01); *H01L 2224/29111* (2013.01); *H01L 2224/29117* (2013.01); *H01L 2224/29139* (2013.01); *H01L 2224/29144* (2013.01); *H01L 2224/29147* (2013.01); *H01L 2224/29155* (2013.01); *H01L 2224/32225* (2013.01); *H01L 2924/014* (2013.01); *H01L 2924/01052* (2013.01); *H01L 2924/3512* (2013.01)

(58) Field of Classification Search
None
See application file for complete search history.

(56) References Cited

U.S. PATENT DOCUMENTS

| | | | |
|---|---|---|---|
| 9,044,816 B2 | 6/2015 | Nakano et al. | |
| 2005/0173498 A1* | 8/2005 | Mori | B23K 1/0016 228/246 |
| 2006/0102690 A1* | 5/2006 | Hirata | B23K 35/262 228/56.3 |
| 2015/0196978 A1 | 7/2015 | Iseki et al. | |

(Continued)

FOREIGN PATENT DOCUMENTS

| | | |
|---|---|---|
| JP | 2006-035310 | 2/2006 |
| JP | 4147875 B | 9/2008 |

(Continued)

*Primary Examiner* — Mounir S Amer
(74) *Attorney, Agent, or Firm* — Wenderoth, Lind & Ponack, L.L.P.

(57) ABSTRACT

A solder alloy of the disclosure includes Sb of which a content is in a range of 3 wt % to 30 wt %, Te of which a content is in a range of 0.01 wt % to 1.5 wt %, Au of which a content is in a range of 0.005 wt % to 1 wt %, at least one of Ag and Cu, wherein a content rate of at least one of Ag and Cu in the solder alloy is in a range of 0.1 wt % to 20 wt %; and a content rate of a sum of Ag and Cu in the solder alloy is in a range of 0.1 wt % to 20 wt %; and a balance of Sn.

3 Claims, 2 Drawing Sheets

(56) References Cited

U.S. PATENT DOCUMENTS

2016/0035690 A1    2/2016  Kido et al.
2018/0117715 A1*   5/2018  Momokawa ........... B23K 35/26

FOREIGN PATENT DOCUMENTS

| JP | 2016/185673 | * 11/2016 | ............ B23K 35/26 |
| WO | 2011/027659 | 3/2011 | |
| WO | 2014/017568 | 1/2014 | |
| WO | 2014/181883 | 11/2014 | |

* cited by examiner

SOLDER ALLOY AND BONDED STRUCTURE USING THE SAME

BACKGROUND

1. Technical Field

The present disclosure relates to a solder alloy used in a power module or the like, and a bonded structure using the same.

2. Description of the Related Art

As a conventional solder alloy and a bonded structure using the same, for example, a brazing filler metal containing Sb in a range of 5 mass % to 20 mass %, Te in a range of 0.01 mass % to 5 mass %, and the balance of Sn, optional additives, and inevitable impurities, and a semiconductor apparatus which is assembled by the brazing filler metal is disclosed in Japanese Patent No. 4147875.

SUMMARY

In the solder alloy disclosed in Japanese Patent No. 4147875, although Te, Ag, Cu, Fe, and Ni are added to Sn so as to improve the bonding reliability, the temperature cycle test is performed only for 500 cycles. Therefore, there was a concern in that the bonding reliability was insufficient for the purpose such as on-board which requires reliability enough to withstand the temperature cycle test of 1000 cycles or more. The present disclosure has been made to solve the above-described conventional problems, and an object thereof is to provide a solder alloy that enhances crack resistance of a solder bonded portion and realizes high reliability.

A solder alloy of the disclosure includes Sb of which a content is in a range of 3 wt % to 30 wt %, Te of which a content is in a range of 0.01 wt % to 1.5 wt %, Au of which a content is in a range of 0.005 wt % to 1 wt %, at least one of Ag and Cu, wherein a content rate of at least one of Ag and Cu in the solder alloy is in a range of 0.1 wt % to 20 wt %; and a content rate of a sum of Ag and Cu in the solder alloy is in a range of 0.1 wt % to 20 wt %, and a balance of Sn.

According to the disclosure, there is provided a solder alloy for enhancing the crack resistance of a solder bonded portion and realizes high reliability, and a bonded structure using the same.

DETAILED DESCRIPTIONS

Figure 1:
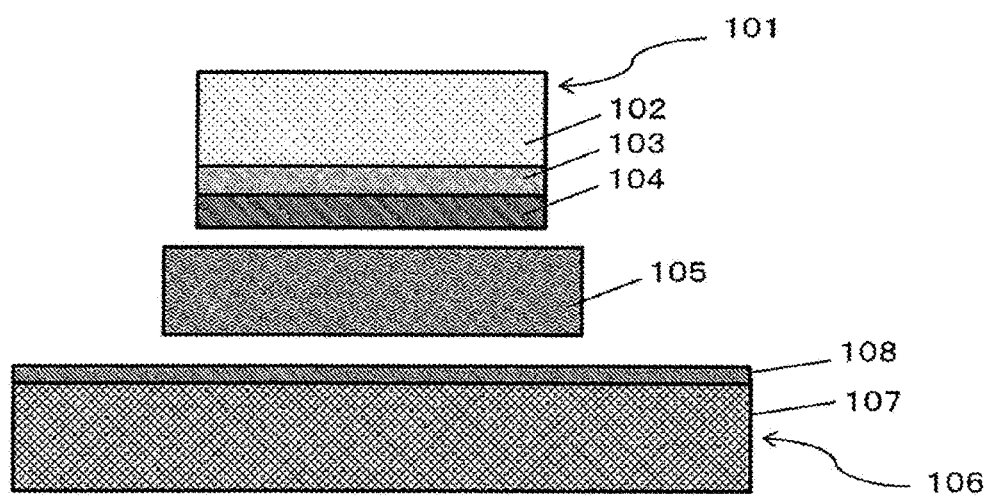
FIG. 1 is an explanatory diagram of a method for manufacturing a bonded structure in one embodiment of the present disclosure.

Prior to detailed description, problems in the related art will be briefly described.

In the solder alloy disclosed in Japanese Patent No. 4147875, although Te, Ag, Cu, Fe, and Ni are added to Sn so as to improve the bonding reliability, the temperature cycle test is performed only for 500 cycles. Therefore, there was a concern in that the bonding reliability was insufficient for the purpose such as on-board which requires reliability enough to withstand the temperature cycle test of 1000 cycles or more. The present disclosure has been made to solve the above-described conventional problems, and an object thereof is to provide a solder alloy that enhances crack resistance of a solder bonded portion and realizes high reliability.

In the solder alloy of the disclosure, the content of Sb is in a range of 3 wt % to 30 wt %, the content of Te is in a range of 0.01 wt % to 1.5 wt %, the content of Au is in a range of 0.005 wt % to 1 wt %, the content of at least one element of Ag and Cu is in a range of 0.1 wt % to 20 wt %, the total content of Ag and Cu is in a range of 0.1 wt % to 20 wt %, and the balance is Sn.

In the specification, "content" is the ratio of the weight of each element to the total weight of the solder alloy and is expressed in unit of wt % (weight percent).

In the specification, "solder alloy" may include trace metals (for example, less than 0.005 wt %) that inevitably contaminate as long as its metal composition is substantially composed of the listed metals. The solder alloy may have any form and may be used for soldering alone, for example, or in combination with other materials (for example, flux) other than metal.

In the solder alloy of the disclosure, Te is added so as to have a predetermined content, and thus elongation due to solid solution of Te in Sn has been improved. Further, since the solder alloy of the disclosure is added so that both Te and Au have a predetermined content, Au having different ionic radius at high temperature is complicatedly substituted with Te which is solidly dissolved in Sn so as to cause dislocation, and thereby the elongation at high temperature has been improved. Therefore, the solder alloy of the disclosure has more excellent elongation at high temperature as compared with the SnSb-based solder to which Te is added alone. As a result, it is possible to absorb the repetitive stress generated during the heat cycle, and thereby the high reliability of the bonded structure can be realized. Since at least one of Ag and Cu is contained in the solder alloy of the disclosure, an intermetallic compound of Ag and Sn, or Cu and Sn is precipitated. When the intermetallic compound is precipitated, the bonding strength is improved, and thereby the high reliability of the bonded structure can be realized.

In the bonded structure of one embodiment, a semiconductor device and a circuit board are bonded to each other via a solder bonded layer containing at least one of Sb, Te, Au, Ag, and Cu, and Sn, and a SnNi alloy and a SnCu alloy are formed on an interface between a metallized layer of the semiconductor device, a plated layer of the circuit board, and the solder bonded layer.

The solder bonded layer of the bonded structure of the embodiment contains Te and Au, and thus elongation at high temperature and room temperature is improved, and the crack resistance is excellent in the heat cycle. Therefore, the high reliability in the bonded structure of the disclosure can be realized.

Hereinafter, the exemplary embodiment of the solder alloy of the disclosure will be described with reference to the drawings.

Solder Alloy 105

Solder alloy 105 is an alloy which contains at least one of Sb (antimony), Te (tellurium), Au (gold), Ag (silver), and Cu (copper), and the balance of Sn (tin).

The content of Sb in solder alloy 105 is in a range of 3 wt % to 30 wt %. The content of Sb in the solder alloy is in such a range, the thermal fatigue characteristic of the solder bonded portion can be improved. When the content of Sb in solder alloy 105 is in a range of 15 wt % to 30 wt %, it is possible to effectively cause the solid solution of Sn in Sb, and thereby the strength and the elongation of solder alloy 105 can be effectively improved.

In solder alloy 105, the content of Te is in a range of 0.01 wt % to 1.5 wt %, the content of Au is in a range of 0.005 wt % to 1 wt %, and the balance is Sn. Here, in solder alloy 105, Au may be provided to perform plating on the surface of solder alloy 105 containing at least one of Sb, Te, Ag, and Cu, and the balance of Sn. In this case, Au is melted into solder alloy 105 at the time of melting solder alloy 105. Since the solder alloy of the disclosure is added so that both Te and Au have a predetermined content, Au having different ionic radius at high temperature is complicatedly substituted with Te which is solidly dissolved in Sn so as to cause dislocation, and thereby the elongation at high temperature has been improved. Therefore, the solder alloy of the disclosure has more excellent elongation at high temperature as compared with the SnSb-based solder to which Te is added alone. Therefore, it is possible to absorb the repetitive stress generated during the heat cycle, and to enhance the crack resistance, and thereby the high reliability of the bonded structure can be realized.

In solder alloy 105, the content of at least one of Ag and Cu is in a range of 0.1 wt % to 20 wt %, is further preferably in a range of 1 wt % to 15 wt %, and the total content of Ag and Cu is in a range of 0.1 wt % to 20 wt %. When the content of at least one of Ag and Cu is in a range of 0.1 wt % to 20 wt %, it is possible to effectively precipitate the intermetallic compound of Ag and Sn, or Cu and Sn. As a result, it is possible to improve the bonding strength of the solder alloy, and thereby the high reliability of the bonded structure can be realized. When at least one of Ag and Cu is within such a range, the intermetallic compound of Ag and Sn, or Cu and Sn accelerates transfer of Te, Sb and Au, or the like which is solidly dissolved in Sn, and thereby it is possible to improve the elongation at high temperature of the solder alloy as compared with a case where only Te is added. When at least one of Ag and Cu is within such a range, intermetallic compound $Ag_3Sn$ of Ag and Sn, or intermetallic compound $Cu_6Sn_5$ of Cu and Sn are precipitated, the strength is improved at high temperature and the crack resistance can be enhanced.

Solder alloy 105 can be obtained in various sizes depending on the bonded structure to be manufactured, and for example, solder alloy 105 having 10 mm$^2$ in size and the thickness in a range of 0.05 mm to 0.5 mm. When the thickness of solder alloy 105 is equal to or smaller than 0.5 mm, the thermal resistance of the solder bonded portion to be formed is not increased and the heat of semiconductor device 101 can be efficiently released. When the thickness of solder alloy 105 is equal to or larger than 0.05 mm, it is possible to suppress the occurrence of voids at the time of solder bonding, and thereby the thermal resistance of the solder bonded portion can be reduced.

Next, the bonded structure of the exemplary embodiment of the disclosure will be described with reference to the drawings.

Semiconductor Device 101

In FIG. 1, semiconductor device 101 includes silicon chip 102, ohmic layer 103 formed on the lower surface of silicon chip 102, and formed metallized layer 104 on the lower surface of ohmic layer 103. In terms of ease of manufacture, silicon chip 102 preferably has a vertical length of 10 mm, a horizontal length of 10 mm, and a thickness of 0.2 mm; however, the size is not limited thereto, and the various sizes can be used.

Ohmic layer 103 of semiconductor device 101 is a layer formed of an optional pure metal or an alloy, and the material thereof is not limited; for example, Ti, Al, Cr, Ni, or an alloy containing all of them can be used. When the above metal is used in the ohmic layer, an appropriate ohmic bonding can be obtained. The thickness of ohmic layer 103 is not particularly limited, and for example, it may be in a range of 0.05 μm to 0.5 μm, or may be 0.1 μm. When ohmic layer 103 has such a thickness, it is likely to secure low resistance value and the bonding reliability.

Metallized layer 104 of semiconductor device 101 is a layer formed of an optional pure metal or an alloy, and the material thereof is not limited; for example, Ni, Cu, or an alloy containing all of them can be used. The thickness of metallized layer 104 is not particularly limited, and for example, it may be in a range of 0.5 μm to 10 μm, or may be 1 μm. When metallized layer 104 has such a thickness, it is possible to firmly bond with solder alloy.

Circuit Board 106

Circuit board 106 includes lead frame 107 and plated layer 108 formed on the surface of lead frame 107.

For the material of lead frame 107 of circuit board 106, a material having good thermal conductivity such as metal or ceramics can be used. The material of lead frame 107 is not limited to the above materials, and for example, it is possible to use copper, aluminum, alumina, aluminum nitride, silicon nitride, and the like. In terms of ease of manufacture, lead frame 107 preferably has a vertical length of 20 mm, a horizontal length of 20 mm, and a thickness of 1 mm; however, the size is not limited thereto, and the various sizes can be used.

Plated layer 108 of circuit board 106 is a layer formed of an optional pure metal or an alloy, and the material thereof is not limited; for example, Ni, Cu, or an alloy containing all of them can be used. The thickness of the plated layer is not particularly limited, and for example, it may be in a range of 0.5 μm to 10 μm, or may be 1 μm. When the plated layer has such a thickness, it is possible to firmly bond with solder alloy.

Bonded Structure 201

Figure 2:
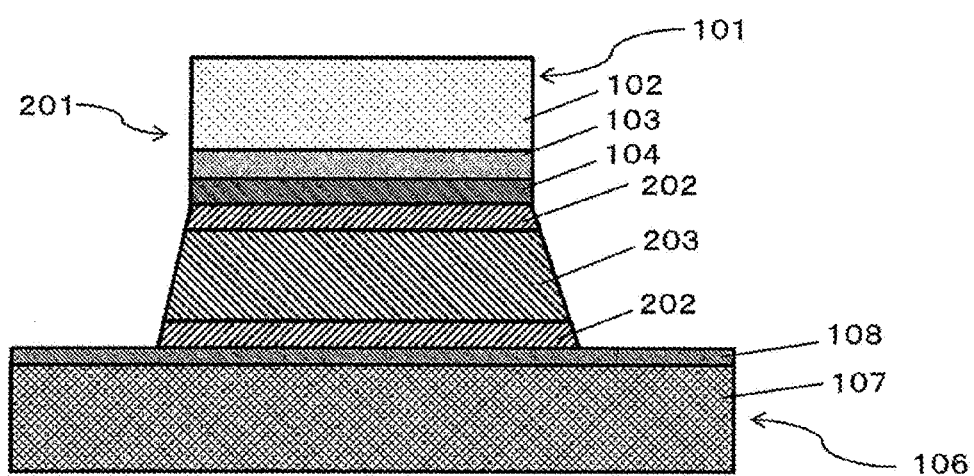
FIG. 2 is an explanatory diagram of a bonded structure in one embodiment of the present disclosure.

Bonded structure 201 manufactured by using the solder alloy of the disclosure is schematically illustrated in FIG. 2. Bonded structure 201 is configured in which semiconductor device 101 and circuit board 106 are bonded to each other via alloy layer 202 and solder bonded layer 203.

In order to manufacture the bonded structure 201, as illustrated in FIG. 1, solder alloy 105 is placed on plated layer 108 of circuit board 106, and semiconductor element 101 is placed on solder alloy 105 such that solder alloy 105 and metallized layer 104 of semiconductor device 101 are in contact with each other. Subsequently, when heating is performed from room temperature to 300° C. while increasing the temperature by 10° C. per minute, after holding at 300° C. for one minute, and cooling is performed from 300° C. to room temperature while decreasing the temperature by 10° C. per minute, alloy layer 202 is formed between solder alloy 105, metallized layer 104, and plated layer 108, and thereby it is possible to manufacture bonded structure 201 as illustrated in FIG. 2.

In such a manufacturing process of the bonded structure, alloy layer 202 of bonded structure 201 is an intermetallic compound formed on an interface between metallized layer 104 of the semiconductor device, the plated layer of circuit board 108, and solder bonded layer 203. In a case where Ni or Cu is contained in metallized layer 104 and plated layer 108, a SnNi (tin-nickel) alloy is contained in alloy layer 202. When the SnNi alloy or the SnCu alloy is formed on alloy layer 202 between metallized layer 104, plated layer 108 of the circuit board, and solder bonded layer 203, metallized layer 104, plated layer 108 of the circuit board, and solder bonded layer 203 are bonded by metal, and thereby it is possible to excellent bonding strength. At least one of Te and Au may be contained in the SnNi alloy and the SnCu alloy which can be contained in alloy layer 202, and when at least one of Te and Au is contained in the SnNi alloy and the SnCu alloy, alloy layer 202 becomes a multinary alloy, the strength of the alloy is improved, and occurrence of cracks in alloy layer 202 can be suppressed even when stress is applied due to a heat cycle or the like. Solder bonded layer 203 of bonded structure 201 contains metal elements such as Sb, Te, Au, Ag, and Cu contained in solder alloy 105, and has substantially the same composition as that of solder alloy 105 before bonding; however, in solder bonded layer 203, the content of Sn is decreased by the rate at which Sn reacts at the time of forming alloy layer 202.

Example 1

As indicated in Table 1, a plurality solder alloys 105 containing different contents of Sb, Te, Au, Ag, and Cu, and the balance of Sn are prepared so as to conduct a tensile test at an ambient temperature of 125° C. For the tensile test, an evaluation sample in which the solder alloy was cast in a dumbbell shape was prepared. Regarding the shape of the evaluation sample, a portion fixed in a testing machine is set to have 6 mm in diameter, and 20 mm in the length, and a dumbbell narrow portion has 3 mm in diameter and 20 mm in the length. The tensile test of the evaluation sample was conducted by setting an interval between upper and lower sample fixing jigs of the tensile testing machine to be 20 mm, fixing the evaluation sample, setting the ambient temperature to be 200° C., and then pulling the evaluation sample with the tensile testing machine so that only the axial force of the evaluation sample is applied.

The tensile strength (MPa) of the evaluation sample us a stress corresponding to the maximum force applied during the test when the tensile test is conducted at a strain rate of $2.0 \times 10^{-4}$/s with respect to 20 mm of interval of the fixed jig before the test.

The elongation (%) of the evaluation sample is the ratio of increment of the fixing jig interval when the evaluation sample was broken in the tensile test with respect to 20 mm of interval of the fixing jig before the test. For example, in a case where the interval of the fixing jig is 40 mm when the evaluation sample is broken, the elongation is $(40-20)/20 \times 100 = 100 (\%)$.

The measurement results of the tensile strength (MPa) and the elongation (%) in the tensile test are also indicated in Table 1.

TABLE 1

| | Sb content (wt %) | Te content (wt %) | Au content (wt %) | Ag content (wt %) | Cu content (wt %) | Strength (MPa) | Elongation (%) |
|---|---|---|---|---|---|---|---|
| Example 1-1 | 3 | 0.01 | 0.005 | 0.1 | 0 | 30 | 130 |
| Example 1-2 | 30 | 1.5 | 1 | 20 | 0 | 39 | 132 |
| Example 1-3 | 3 | 0.01 | 0.005 | 0 | 0.1 | 29 | 135 |
| Example 1-4 | 30 | 1.5 | 1 | 0 | 20 | 40 | 131 |
| Comparative Example 1-1 | 3 | 0.01 | 0.005 | 0 | 0 | 24 | 87 |
| Comparative Example 1-2 | 30 | 1.5 | 1 | 0 | 0 | 25 | 85 |

Example 1-1 and Example 1-2 are solder alloys of the disclosure which do not contain Cu but contain Ag. In Example 1-1, the content of Sb was 3 wt %, the content of Te was 0.01 wt %, the content of Au was 0.005 wt %, and the content of Ag was 0.1 wt %. In Example 1-2, the content of Sb was 30 wt %, the content of Te was 1.5 wt %, the content of Au was 1 wt %, and the content of Ag was 20 wt %. In Example 1-1, the strength was 30 MPa and the elongation was 130%. In Example 1-2, the strength was 39 MPa and the elongation was 132%. In any of Example 1-1 and Example 1-2, it is possible to obtain excellent effects.

Example 1-3 and Example 1-4 are solder alloys of the disclosure which do not contain Ag but contain Cu. In Example 1-3, the content of Sb was 3 wt %, the content of Te was 0.01 wt %, the content of Au was 0.005 wt %, and the content of Cu was 0.1 wt %. In Example 1-4, the content of Sb was 30 wt %, the content of Te was 1.5 wt %, the content of Au was 1 wt %, and the content of Cu was 20 wt %. In Example 1-3, the strength was 29 MPa and the elongation was 135%. In Example 1-4, the strength was 40 MPa and the elongation was 131%. In any of Example 1-3 and Example 1-4, it is possible to obtain excellent effects.

In Comparative Example 1-1 and Comparative Example 1-2, neither Ag nor Cu was used. In Comparative Example 1-1, the strength was 24 MPa and the elongation was 87%. In Comparative Example 1-2, the strength was 25 MPa and the elongation was 85%.

From the above results, it has been made clear that the elongation and tensile strength of solder alloy 105 can be improved by containing Ag or Cu. The reason for this is due to the effect of solid solution of Te and Au in a Sn parent phase, and precipitation of intermetallic compounds of Ag and Sn, or Cu and Sn by containing Ag or Cu. As a result, it is possible to absorb the repetitive stress generated during the heat cycle, and thereby the high reliability of the bonded structure can be realized.

Example 2

As indicated in Tables 2 to 4, solder alloys 105 in Examples 2-1 to 2-64 and Comparative Examples 2-1 to 2-36, which contain different contents of Sb, Te, Au, Ag, and Cu, and the balance of Sn, were prepared, and bonded structure 201 was manufactured by using each of prepared solder alloys 105. Any of bonded structures 201 having solder alloys 105 of Examples 2-1 to 2-64 and Comparative Examples 2-1 to 2-36 was manufactured by the following method using the following members.

Semiconductor device 101 having a configuration in which ohmic layer 103 formed of Ti is provided on the lower surface of silicon chip 102 which has a vertical length of 10 mm, a horizontal length of 10 mm, and a thickness of 0.2 mm, and metallized layer 104 formed on Ni is provided on the lower surface of ohmic layer 103 was prepared. Circuit board 106 having a configuration in which a lead frame formed of copper which has a vertical length of 20 mm, a horizontal length of 20 mm, and a thickness of 1 mm is provided, and plated layer 108 which is formed of Ni and has the thickness of 1 μm is provided on the surface of lead frame 107 was prepared.

Next, solder alloy 105 having the thickness of 0.1 mm is placed on plated layer 108 formed of Ni of the prepared circuit board 106, semiconductor device 101 is installed on solder alloy 105 such that solder alloy 105 is in contact with metallized layer 104 formed of Ni, and then heating was performed from room temperature to 300° C. while increasing the temperature by 10° C. per minute. Bonded structure 201 was manufactured by performing cooling from 300° C. to room temperature while decreasing the temperature by 10° C. per minute after holding at 300° C. for one minute.

A heat cycle test was performed on bonded structures 201 of Examples 2-1 to 2-64 and Comparative Examples 2-1 to 2-36 so as to evaluate the crack resistance. In the heat cycle test, a cycle of −40° C. and 150° C. for 5 minutes was set as one cycle using a liquid tank test tank, and 1000 cycles of tests were performed. The sample after the test was observed with an ultrasonic microscope and a peeled-off area was divided by a bonded area so as to calculate the crack rate. When the crack rate exceeds 10%, the heat generation of the silicon chip cannot be efficiently released to the lead frame. Thus if the crack rate is equal to or less than 10%, it is determined as "good", and if the crack rate is more than 10%, it is determined as "poor".

The measurement results of the crack rate (%) and the determination result in the heat cycle test are also indicated in Tables 2 to 4.

TABLE 2

| | Sb content (wt %) | Te content (wt %) | Au content (wt %) | Ag content (wt %) | Cu content (wt %) | Crack rate (%) | Determination |
|---|---|---|---|---|---|---|---|
| Example 2-1 | 3 | 0.01 | 0.005 | 0.1 | 0 | 9 | Good |
| Example 2-2 | 3 | 0.01 | 0.005 | 20 | 0 | 6 | Good |
| Example 2-3 | 3 | 0.01 | 0.005 | 0 | 0.1 | 7 | Good |
| Example 2-4 | 3 | 0.01 | 0.005 | 0 | 20 | 8 | Good |
| Example 2-5 | 3 | 0.01 | 1 | 0.1 | 0 | 5 | Good |
| Example 2-6 | 3 | 0.01 | 1 | 20 | 0 | 9 | Good |
| Example 2-7 | 3 | 0.01 | 1 | 0 | 0.1 | 7 | Good |
| Example 2-8 | 3 | 0.01 | 1 | 0 | 20 | 8 | Good |
| Example 2-9 | 3 | 1.5 | 0.005 | 0.1 | 0 | 6 | Good |
| Example 2-10 | 3 | 1.5 | 0.005 | 20 | 0 | 8 | Good |
| Example 2-11 | 3 | 1.5 | 0.005 | 0 | 0.1 | 9 | Good |
| Example 2-12 | 3 | 1.5 | 0.005 | 0 | 20 | 6 | Good |
| Example 2-13 | 3 | 1.5 | 1 | 0.1 | 0 | 7 | Good |
| Example 2-14 | 3 | 1.5 | 1 | 20 | 0 | 5 | Good |
| Example 2-15 | 3 | 1.5 | 1 | 0 | 0.1 | 7 | Good |
| Example 2-16 | 3 | 1.5 | 1 | 0 | 20 | 8 | Good |
| Example 2-17 | 15 | 0.01 | 0.005 | 0.1 | 0 | 6 | Good |
| Example 2-18 | 15 | 0.01 | 0.005 | 20 | 0 | 9 | Good |
| Example 2-19 | 15 | 0.01 | 0.005 | 0 | 0.1 | 7 | Good |
| Example 2-20 | 15 | 0.01 | 0.005 | 0 | 20 | 8 | Good |

TABLE 2-continued

|  | Sb content (wt %) | Te content (wt %) | Au content (wt %) | Ag content (wt %) | Cu content (wt %) | Crack rate (%) | Determination |
|---|---|---|---|---|---|---|---|
| Example 2-21 | 15 | 0.01 | 1 | 0.1 | 0 | 7 | Good |
| Example 2-22 | 15 | 0.01 | 1 | 20 | 0 | 8 | Good |
| Example 2-23 | 15 | 0.01 | 1 | 0 | 0.1 | 6 | Good |
| Example 2-24 | 15 | 0.01 | 1 | 0 | 20 | 9 | Good |
| Example 2-25 | 15 | 1.5 | 0.005 | 0.1 | 0 | 5 | Good |
| Example 2-26 | 15 | 1.5 | 0.005 | 20 | 0 | 8 | Good |
| Example 2-27 | 15 | 1.5 | 0.005 | 0 | 0.1 | 6 | Good |
| Example 2-28 | 15 | 1.5 | 0.005 | 0 | 20 | 7 | Good |
| Example 2-29 | 15 | 1.5 | 1 | 0.1 | 0 | 7 | Good |
| Example 2-30 | 15 | 1.5 | 1 | 20 | 0 | 9 | Good |
| Example 2-31 | 15 | 1.5 | 1 | 0 | 0.1 | 5 | Good |
| Example 2-32 | 15 | 1.5 | 1 | 0 | 20 | 6 | Good |

TABLE 3

|  | Sb content (wt %) | Te content (wt %) | Au content (wt %) | Ag content (wt %) | Cu content (wt %) | Crack rate (%) | Determination |
|---|---|---|---|---|---|---|---|
| Example 2-33 | 30 | 0.01 | 0.005 | 0.1 | 0 | 9 | Good |
| Example 2-34 | 30 | 0.01 | 0.005 | 20 | 0 | 8 | Good |
| Example 2-35 | 30 | 0.01 | 0.005 | 0 | 0.1 | 7 | Good |
| Example 2-36 | 30 | 0.01 | 0.005 | 0 | 20 | 6 | Good |
| Example 2-37 | 30 | 0.01 | 1 | 0.1 | 0 | 8 | Good |
| Example 2-38 | 30 | 0.01 | 1 | 20 | 0 | 7 | Good |
| Example 2-39 | 30 | 0.01 | 1 | 0 | 0.1 | 9 | Good |
| Example 2-40 | 30 | 0.01 | 1 | 0 | 20 | 9 | Good |
| Example 2-41 | 30 | 1.5 | 0.005 | 0.1 | 0 | 8 | Good |
| Example 2-42 | 30 | 1.5 | 0.005 | 20 | 0 | 6 | Good |
| Example 2-43 | 30 | 1.5 | 0.005 | 0 | 0.1 | 7 | Good |
| Example 2-44 | 30 | 1.5 | 0.005 | 0 | 20 | 9 | Good |
| Example 2-45 | 30 | 1.5 | 1 | 0.1 | 0 | 8 | Good |
| Example 2-46 | 30 | 1.5 | 1 | 20 | 0 | 6 | Good |
| Example 2-47 | 30 | 1.5 | 1 | 0 | 0.1 | 7 | Good |
| Example 2-48 | 30 | 1.5 | 1 | 0 | 20 | 6 | Good |
| Example 2-49 | 3 | 0.01 | 0.005 | 0.05 | 0.05 | 5 | Good |
| Example 2-50 | 3 | 0.01 | 1 | 0.05 | 0.05 | 5 | Good |
| Example 2-51 | 3 | 0.01 | 0.005 | 10 | 10 | 6 | Good |
| Example 2-52 | 3 | 0.01 | 1 | 10 | 10 | 9 | Good |
| Example 2-53 | 3 | 1.5 | 0.005 | 0.05 | 0.05 | 7 | Good |
| Example 2-54 | 3 | 1.5 | 1 | 0.05 | 0.05 | 8 | Good |
| Example 2-55 | 3 | 1.5 | 0.005 | 10 | 10 | 6 | Good |
| Example 2-56 | 3 | 1.5 | 1 | 10 | 10 | 8 | Good |
| Example 2-57 | 30 | 0.01 | 0.005 | 0.05 | 0.05 | 6 | Good |
| Example 2-58 | 30 | 0.01 | 1 | 0.05 | 0.05 | 9 | Good |
| Example 2-59 | 30 | 0.01 | 0.005 | 10 | 10 | 7 | Good |
| Example 2-60 | 30 | 0.01 | 1 | 10 | 10 | 8 | Good |
| Example 2-61 | 30 | 1.5 | 0.005 | 0.05 | 0.05 | 6 | Good |
| Example 2-62 | 30 | 1.5 | 1 | 0.05 | 0.05 | 9 | Good |
| Example 2-63 | 30 | 1.5 | 0.005 | 10 | 10 | 7 | Good |
| Example 2-64 | 30 | 1.5 | 1 | 10 | 10 | 8 | Good |

TABLE 4

|  | Sb content (wt %) | Te content (wt %) | Au content (wt %) | Ag content (wt %) | Cu content (wt %) | Crack rate (%) | Determination |
|---|---|---|---|---|---|---|---|
| Comparative Example 2-1 | 2 | 0.01 | 0.005 | 0.1 | 0 | 27 | Poor |
| Comparative Example 2-2 | 2 | 0.01 | 1 | 20 | 0 | 28 | Poor |
| Comparative Example 2-3 | 2 | 0.01 | 0.005 | 0 | 0.1 | 31 | Poor |
| Comparative Example 2-4 | 2 | 0.01 | 1 | 0 | 20 | 33 | Poor |
| Comparative Example 2-5 | 31 | 1.5 | 0.005 | 0.1 | 0 | 26 | Poor |
| Comparative Example 2-6 | 31 | 1.5 | 1 | 20 | 0 | 28 | Poor |
| Comparative Example 2-7 | 31 | 1.5 | 0.005 | 0 | 0.1 | 34 | Poor |
| Comparative Example 2-8 | 31 | 1.5 | 1 | 0 | 20 | 31 | Poor |
| Comparative Example 2-9 | 3 | 0.005 | 0.005 | 0.1 | 0 | 29 | Poor |

TABLE 4-continued

|  | Sb content (wt %) | Te content (wt %) | Au content (wt %) | Ag content (wt %) | Cu content (wt %) | Crack rate (%) | Determination |
|---|---|---|---|---|---|---|---|
| Comparative Example 2-10 | 3 | 0.005 | 1 | 20 | 0 | 27 | Poor |
| Comparative Example 2-11 | 3 | 0.005 | 0.005 | 0 | 0.1 | 32 | Poor |
| Comparative Example 2-12 | 3 | 0.005 | 1 | 0 | 20 | 25 | Poor |
| Comparative Example 2-13 | 30 | 1.6 | 0.005 | 0.1 | 0 | 29 | Poor |
| Comparative Example 2-14 | 30 | 1.6 | 1 | 20 | 0 | 36 | Poor |
| Comparative Example 2-15 | 30 | 1.6 | 0.005 | 0 | 0.1 | 31 | Poor |
| Comparative Example 2-16 | 30 | 1.6 | 1 | 0 | 20 | 32 | Poor |
| Comparative Example 2-17 | 3 | 0.01 | 0.001 | 0.1 | 0 | 35 | Poor |
| Comparative Example 2-18 | 3 | 0.01 | 0.001 | 20 | 0 | 26 | Poor |
| Comparative Example 2-19 | 3 | 0.01 | 0.001 | 0 | 0.1 | 29 | Poor |
| Comparative Example 2-20 | 3 | 0.01 | 0.001 | 0 | 20 | 31 | Poor |
| Comparative Example 2-21 | 30 | 1.5 | 2 | 0.1 | 0 | 27 | Poor |
| Comparative Example 2-22 | 30 | 1.5 | 2 | 20 | 0 | 32 | Poor |
| Comparative Example 2-23 | 30 | 1.5 | 2 | 0 | 0.1 | 28 | Poor |
| Comparative Example 2-24 | 30 | 1.5 | 2 | 0 | 20 | 31 | Poor |
| Comparative Example 2-25 | 3 | 0.01 | 0.005 | 0.05 | 0 | 21 | Poor |
| Comparative Example 2-26 | 3 | 0.01 | 0.005 | 0 | 0.05 | 35 | Poor |
| Comparative Example 2-27 | 30 | 1.5 | 1 | 21 | 0 | 27 | Poor |
| Comparative Example 2-28 | 30 | 1.5 | 1 | 0 | 21 | 26 | Poor |
| Comparative Example 2-29 | 3 | 0.01 | 0.005 | 0.04 | 0.04 | 33 | Poor |
| Comparative Example 2-30 | 3 | 0.01 | 0.005 | 10.5 | 10.5 | 33 | Poor |
| Comparative Example 2-31 | 30 | 1.5 | 1 | 0.04 | 0.04 | 30 | Poor |
| Comparative Example 2-32 | 30 | 1.5 | 1 | 10.5 | 10.5 | 23 | Poor |
| Comparative Example 2-33 | 3 | 0.01 | 0.005 | 0.01 | 0.01 | 32 | Poor |
| Comparative Example 2-34 | 3 | 0.01 | 0.005 | 11 | 20 | 27 | Poor |
| Comparative Example 2-35 | 30 | 1.5 | 1 | 0.01 | 0.01 | 25 | Poor |
| Comparative Example 2-36 | 30 | 1.5 | 1 | 20 | 20 | 31 | Poor |

Examples 2-1, 2-3, 2-6, and 2-8 are different from Comparative Examples 2-1, 2-3, 2-2, and 2-4 in which the content of Sb is 2 wt % from the aspect that the content of Sb is 3 wt %. The crack rates of Examples 2-1, 2-3, 2-6, and 2-8 were 9%, 7%, 9%, and 8%, and thus the determination was "good". In contrast, the crack rates of Comparative Examples 2-1, 2-3, 2-2, and 2-4 were 27%, 31%, 28%, and 33%, and thus the determination was "poor".

Examples 2-41, 2-43, 2-46, and 2-48 are different from Comparative Examples 2-5, 2-6, 2-7, and 2-8 in which the content of Sb is 31 wt % from the aspect that the content of Sb is 30 wt %. The crack rates of Examples 2-41, 2-43, 2-46, and 2-48 were 8%, 7%, 6%, and 6%, and thus the determination was "good". In contrast, the crack rates of Comparative Examples 2-5, 2-7, 2-6 and 2-8 were 26%, 34%, 28%, and 31%, and thus the determination was "poor".

From this result, it was found that crack resistance is enhanced when Sb is in a range of 3 wt % to 30 wt %. The reason for this is inferred that when the SnSb compound exhibits the effect of dispersion strength, if the content of Sb is small, the effect cannot be obtained; whereas if the content of Sb is large, the strength is improved, but the ductility of the solder alloy is deteriorated, so that the crack resistance is deteriorated.

In all of Example 2-1 to Example 2-64, the content of Sb was in a range of 3 wt % to 30 wt %, the content of Te was in a range of 0.01 wt % to 1.5 wt %, and the content of Au was in a range of 0.005 wt % to 1 wt %. In all of Example 2-1 to Example 2-64, the crack rate is lower than 10%, the result was "good" and a good result was obtained.

Even when the content of Sb is in a range of 3 wt % to 30 wt %, in a case where the content of Te is equal to or less than 0.005 wt % as in Comparative Examples 2-9 to 12, the crack rate is equal to or higher than 25%, and thereby the determination was "poor".

Even when the content of Sb is in a range of 3 wt % to 30 wt %, in a case where the content of Te is equal to or less than 1.6 wt % as in Comparative Examples 2-13 to 16, the crack rate is equal to or higher than 29%, and thereby the determination was "poor".

Even when the content of Sb is in a range of 3 wt % to 30 wt %, in a case where the content of Au is equal to or less than 0.001 wt % as in Comparative Examples 2-17 to 20, the crack rate is equal to or higher than 26%, and thereby the determination was "poor".

Even when the content of Sb is in a range of 3 wt % to 30 wt %, in a case where the content of Au is equal to or more than 2 wt % as in Comparative Examples 2-21 to 24, the crack rate is equal to or higher than 27%, and thereby the determination was "poor".

On the basis of the above results, it was found that when the content of Te is in a range of 0.01 wt % to 1.5 wt %, and the content of Au is in a range of 0.005 wt % to 1 wt %, the crack resistance of the solder material can be effectively enhanced. The reason for this is inferred that when the Te content is equal to or more than 0.01 wt %, the effect of solid solution of Te is effectively obtained, and when the content of Te is equal to or less than 1.5 wt %, precipitation of Te as a compound is suppressed, and thus the ductility was improved so that the crack resistance was enhanced. In addition, when the content of Au is equal to or more than 0.005 wt %, Au having a different ionic radius from Te can be effectively substituted with Te which is solidly solved in Sn such that dislocations are effectively generated, and thereby the elongation high temperature is improved and the crack resistance is enhanced as well. On the other hand, it is presumed that when the content of Au is equal to or less than 1 wt %, the precipitation of a brittle compound containing Au and Sn can be suppressed, and thereby the crack resistance is improved.

Even when the content of Sb is in a range of 3 wt % to 30 wt %, and the content of Te is in a range of 0.01 wt % to 1.5 wt %, and the content of Au is in a range of 0.005 wt % to 1 wt %, in a case where the content of Ag is equal to or less than 0.05 wt % as indicated in Comparative Example 2-25, and the content of Ag is equal to or more than 21 wt % as indicated in Comparative Example 2-27, the crack rate is equal to higher than 21%, and thereby the determination was "poor".

Even when the content of Sb is in a range of 3 wt % to 30 wt %, and the content of Te is in a range of 0.01 wt % to 1.5 wt %, and the content of Au is in a range of 0.005 wt % to 1 wt %, in a case where the content of Cu is equal to or less than 0.05 wt % as indicated in Comparative Example 2-26, and the content of Cu is equal to or more than 21 wt % as indicated in Comparative Example 2-28, the crack rate is equal to higher than 26%, and thereby the determination was "poor".

In a case where the content of Sb is in a range of 3 wt % to 30 wt %, the content of Te is in a range of 0.01 wt % to 1.5 wt %, and the content of Au is in a range of 0.005 wt % to 1 wt %, and in a case where the total content of Ag and Cu is in a range of 0.1 wt % to 20 wt % as indicated in Examples 2-49 to 2-64, the crack rates in all the cases are lower than 10%, and thus the determination was "good". However, in a case where the total content of Ag and Cu is equal to or less than 0.08 wt %, or equal to or more than 21 wt % as indicated in Comparative Examples 2-29 to 2-36, the crack rate was equal to or more than 20%.

On the basis of the above results, it was found that when total content of Ag and Cu is in a range of 0.1 wt % to 20 wt %, the crack resistance of the solder material can be effectively enhanced. The reason for this is considered that when the total content of Ag and Cu is equal to or more than 0.1 wt %, at least one of the intermetallic compound of Sn and Au and the intermetallic compound of Sn and Cu is precipitated at a constant amount, and thereby the strength is improved. Also, it is considered that when the total content of Ag and Cu is equal to or less than 21 wt %, the amount of intermetallic compound with Sn is not excessively large, and a certain amount of Te and Au are solidly dissolved in Sn, and therefore, therefore, the improvement of elongation, which is the effect of the solid solution, was effectively obtained. With this, it is considered that the stress at the time of the heat cycle can be absorbed and thereby the crack resistance is enhanced.

On the basis of the above results, it was found that when the content of Sb is in a range of 3 wt % to 30 wt %, the content of Te is in a range of 0.01 wt % to 1.5 wt %, the content of Au is in a range of 0.005 wt % to 1 wt %, the content of at least one element of Ag and Cu is in a range of 0.1 wt % to 20 wt %, and the total content of Ag and Cu is in a range of 0.1 wt % to 20 wt %, the crack resistance is enhanced.

As indicated in Table 5, the solder alloys 105 in Examples 2-65 to 2-98, which contain different contents of Sb, Te, Au, Ag, and Cu, and the balance of Sn, were prepared, and bonded structure 201 was manufactured by using each of prepared solder alloys 105. After the bonded structures 201 having the solder alloys 105 in Examples 2-65 to 2-98 were all manufactured by using the same method as that in Example 2-1, the same heat cycle test was performed, and then the measurement and determination of the crack rate (%) were performed. The measurement results and determination are indicated in Table 5.

In Examples 2-65 to 2-80, the content of Cu was equal to or greater than 0.2 wt % and less than 5 wt %.

In addition, in Examples 2-81 to 2-98, the content of Ag was equal to or greater than 0 wt % and less than 20 wt %, and the content of Cu was equal to or greater than 0.05 wt % and less than 5 wt %.

From these results, it was found that all of the crack rates were evaluated as "good", and the content of Cu was greater than 0.05 wt % and less than 5 wt %, the crack rate was likely to be the lowest, and the crack resistance was improved.

Accordingly, among the solder in which the content of Sb is in a range of 3 wt % to 30 wt %, the content of Te is in a range of 0.01 wt % to 1.5 wt %, the content of Au is in a range of 0.005 wt % to 1 wt %, at least one element of Ag and Cu is in a range of 0.1 wt % to 20 wt %, and the content rate of the sum of Ag and Cu is in a range of 0.1 wt % to 20 wt %, particularly, in a case where the content of Cu is equal to or greater than 0.05 wt % and less than 5 wt %, high reliability of the bonded structure can be realized by using a solder alloy with high crack resistance.

TABLE 5

| | Sb content (wt %) | Te content (wt %) | Au content (wt %) | Ag content (wt %) | Cu content (wt %) | Crack rate (%) | Determination |
|---|---|---|---|---|---|---|---|
| Example 2-65 | 3 | 0.01 | 0.005 | 0 | 0.2 | 4 | Good |
| Example 2-66 | 3 | 0.01 | 0.005 | 0 | 1 | 3 | Good |
| Example 2-67 | 3 | 0.01 | 0.005 | 0 | 4 | 4 | Good |
| Example 2-68 | 3 | 0.01 | 0.005 | 0 | 4.9 | 4 | Good |
| Example 2-69 | 3 | 0.01 | 1 | 0 | 0.2 | 3 | Good |
| Example 2-70 | 3 | 0.01 | 1 | 0 | 1 | 3 | Good |
| Example 2-71 | 3 | 0.01 | 1 | 0 | 4 | 3 | Good |
| Example 2-72 | 3 | 0.01 | 1 | 0 | 4.9 | 4 | Good |
| Example 2-73 | 3 | 1.5 | 0.005 | 0 | 0.2 | 4 | Good |
| Example 2-74 | 3 | 1.5 | 0.005 | 0 | 1 | 3 | Good |
| Example 2-75 | 3 | 1.5 | 0.005 | 0 | 4 | 3 | Good |
| Example 2-76 | 3 | 1.5 | 0.005 | 0 | 4.9 | 4 | Good |
| Example 2-77 | 3 | 1.5 | 1 | 0 | 0.2 | 2 | Good |
| Example 2-78 | 3 | 1.5 | 1 | 0 | 1 | 3 | Good |
| Example 2-79 | 3 | 1.5 | 1 | 0 | 4 | 5 | Good |
| Example 2-80 | 3 | 1.5 | 1 | 0 | 4.9 | 4 | Good |
| Example 2-81 | 3 | 0.01 | 0.005 | 0.05 | 0.1 | 4 | Good |
| Example 2-82 | 3 | 0.01 | 0.005 | 0.05 | 1 | 2 | Good |
| Example 2-83 | 3 | 0.01 | 0.005 | 0.05 | 4 | 4 | Good |
| Example 2-84 | 3 | 0.01 | 0.005 | 0.05 | 4.9 | 4 | Good |
| Example 2-85 | 15 | 0.01 | 1 | 19.95 | 0.05 | 4 | Good |
| Example 2-86 | 15 | 0.01 | 1 | 19.9 | 0.1 | 4 | Good |
| Example 2-87 | 15 | 0.01 | 1 | 19 | 1 | 3 | Good |
| Example 2-88 | 15 | 0.01 | 1 | 16 | 4 | 4 | Good |

TABLE 5-continued

|  | Sb content (wt %) | Te content (wt %) | Au content (wt %) | Ag content (wt %) | Cu content (wt %) | Crack rate (%) | Determination |
|---|---|---|---|---|---|---|---|
| Example 2-89 | 15 | 0.01 | 1 | 15.1 | 4.9 | 4 | Good |
| Example 2-90 | 15 | 1.5 | 0.005 | 19.95 | 0.05 | 4 | Good |
| Example 2-91 | 15 | 1.5 | 0.005 | 19.9 | 0.1 | 4 | Good |
| Example 2-92 | 15 | 1.5 | 0.005 | 19 | 1 | 3 | Good |
| Example 2-93 | 15 | 1.5 | 0.005 | 16 | 4 | 4 | Good |
| Example 2-94 | 15 | 1.5 | 0.005 | 15.1 | 4.9 | 4 | Good |
| Example 2-95 | 30 | 1.5 | 1 | 10 | 0.1 | 3 | Good |
| Example 2-96 | 30 | 1.5 | 1 | 10 | 1 | 4 | Good |
| Example 2-97 | 30 | 1.5 | 1 | 10 | 4 | 4 | Good |
| Example 2-98 | 30 | 1.5 | 1 | 10 | 4.9 | 4 | Good |

Example 3

The solder alloy of the disclosure and the bonded structure using the same were manufactured as follows.

Solder alloy 105, semiconductor device 101, and circuit board 106 were prepared. First, an alloy containing 3 wt % of Sb, 0.01 wt % of Te, 20 wt % of Ag, and the balance of Sn was formed into a sheet shape having a thickness of 0.1 mm so as to obtain solder alloy 105. Then, both surfaces of solder alloy 105 formed into the sheet shape were coated with an Au film having the thickness of 0.19 µm such that the content of Au of solder alloy 105 was 1 wt % when solder alloy 105 is melted and mixed with the entire Au film on the both surfaces. In the composition ratio of solder alloy 105 melted and mixed with the Au plating, Sb was 3 wt %, Te was 0.01 wt %, Au was 1 wt %, Ag was 20 wt %, and the balance was Sn.

Semiconductor device 101 having a configuration in which ohmic layer 103 formed of Ti is provided on the lower surface of silicon chip 102 which has a vertical length of 10 mm, a horizontal length of 10 mm, and a thickness of 0.2 mm, and metallized layer 104 formed on Ni is provided on the lower surface of ohmic layer 103 was prepared. Circuit board 106 having a configuration in which a lead frame formed of copper which has a vertical length of 20 mm, a horizontal length of 20 mm, and a thickness of 1 mm is provided, and plated layer 108 which is formed of Ni and has the thickness of 1 µm is provided on the surface of lead frame 107 was prepared.

Solder alloy 105 having the thickness of 100.38 µm is placed on plated layer 108 formed of Ni of the prepared circuit board 106, semiconductor device 101 is installed on solder alloy 105 such that solder alloy 105 is in contact with metallized layer 104 formed of Ni, and then heating was performed from room temperature to 300° C. while increasing the temperature by 10° C. per minute. Bonded structure 201 was manufactured by performing cooling from 300° C. to room temperature while decreasing the temperature by 10° C. per minute after holding at 300° C. for one minute.

The manufactured bonded structure was subjected to the same heat cycle test as that of Example 2 so as to determine the crack resistance. As a result, the crack rate after the heat cycle test of Example 3-1 was 7%, and the determination was "good".

In Example 3-1, the Au plating was performed on the solder alloy containing Sn, Sb, Te, and Ag. In this case, the composition ratio of Au in solder alloy 105 is 1 wt %, and due to the heat at the time of bonding, Au is diffused into the solder bonded layer, and thereby substantially the same bonded structure as that of Example 2-6 is formed.

In the mounting structure (Example 3-2) manufactured under the same conditions as in Example 3-1 except that 20 wt % of Cu was contained instead of Ag, the crack rate was 8%, and thus a good result was obtained. In the mounting structure (Example 3-3) manufactured under the same conditions as in Example 3-1 except that 10 wt % each of Cu and Ag were contained, the crack rate was 7%, and thus a good result was obtained.

In the mounting structure (Example 3-4) manufactured under the same conditions as in Example 3-1 except that 0.1 wt % of Cu was contained instead of Ag, the crack rate was 3%, and thus a good result was obtained.

In the mounting structure (Example 3-4) manufactured under the same conditions as in Example 3-1 except that 0.05 wt % of Ag and 4.9 wt % of Cu were contained, the crack rate was 4%, and thus a good result was obtained.

It was clearly found that Au may be formed on the surface of the solder alloy as long as it is within the composition range of the disclosure.

According to the solder alloy and the bonded structure of the present disclosure, since the elongation and the strength at high temperature are improved and the crack resistance of the bonded structure is enhanced, it is possible to apply the solder alloy and the bonded structure to the application of bonding the semiconductor device such as power module.

What is claimed is:

1. A solder alloy comprising consisting of:
   Sb of which a content is in a range of 3 wt % to 30 wt %;
   Te of which a content is in a range of 0.01 wt % to 1.5 wt %;
   Au of which a content is in a range of 0.005 wt % to 1 wt %,
   at least one of Ag and Cu, wherein
   a content rate of a sum of Ag and Cu in the solder alloy is in a range of 0.1 wt % to 20 wt %; and
   a balance of Sn.

2. A bonded structure, comprising a semiconductor device and a circuit board that are bonded to each other via a solder bonded layer containing the solder alloy of claim 1,
   wherein an interface between the solder bonded layer and each of a metallized layer of the semiconductor device and a plated layer of the circuit board comprises either or both of a SnNi alloy and a SnCu alloy.

3. The structure of claim 2,
   wherein either or both of the SnNi alloy and the SnCu alloy comprise at least one selected from the group consisting of Te and Au.

* * * * *